United States Patent
Lee et al.

(10) Patent No.: US 10,347,556 B2
(45) Date of Patent: *Jul. 9, 2019

(54) PASSIVATION LAYER HAVING OPENING FOR UNDER BUMP METALLURGY

(71) Applicant: SAMSUNG ELECTRO-MECHANICS CO., LTD., Suwon-Si, Gyeonggi-Do (KR)

(72) Inventors: Han Ul Lee, Suwon-Si (KR); Jin Su Kim, Suwon-Si (KR); Young Gwan Ko, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/966,723

(22) Filed: Apr. 30, 2018

(65) Prior Publication Data
US 2019/0013256 A1    Jan. 10, 2019

Related U.S. Application Data

(63) Continuation of application No. 15/802,170, filed on Nov. 2, 2017, now Pat. No. 10,026,668.

(30) Foreign Application Priority Data

Jul. 4, 2017  (KR) .................. 10-2017-0085042

(51) Int. Cl.
*H01L 23/48* (2006.01)
*H01L 21/44* (2006.01)
(Continued)

(52) U.S. Cl.
CPC .... *H01L 23/3128* (2013.01); *H01L 21/31058* (2013.01); *H01L 21/4853* (2013.01);
(Continued)

(58) Field of Classification Search
CPC ................ H01L 24/05; H01L 23/3128; H01L 23/49816; H01L 21/6835; H01L 24/81;
(Continued)

(56) References Cited

U.S. PATENT DOCUMENTS 7,056,818 B2    6/2006  Yang
7,713,861 B2    5/2010  Yu
(Continued)

FOREIGN PATENT DOCUMENTS

JP    2005-286087 A    10/2005

OTHER PUBLICATIONS

Notice of Allowance issued in related parent U.S. Appl. No. 15/802,170, dated Apr. 10, 2018.
(Continued)

*Primary Examiner* — Alonzo Chambliss
(74) *Attorney, Agent, or Firm* — Morgan Lewis & Bockius LLP

(57) ABSTRACT

A semiconductor device includes: a chip having an active surface having connection pads disposed thereon; an encapsulant encapsulating at least portions of the chip; a connection member disposed on the active surface of the chip and including a redistribution layer electrically connected to the connection pads; a passivation layer disposed on the connection member; and an under bump metallurgy (UBM) layer at least partially embedded in the passivation layer and electrically connected to the redistribution layer of the connection member. The UBM layer includes a UBM pad partially embedded in the passivation layer and a UVM via penetrating through a portion of the passivation layer and electrically connecting the redistribution layer of the connection member and the UBM pad to each other. A portion (Continued)

of a side surface of the UBM pad is exposed through an opening formed in the passivation layer and the opening surrounds the UBM pad.

12 Claims, 13 Drawing Sheets

(51) Int. Cl.
H01L 23/31 (2006.01)
H01L 25/18 (2006.01)
H01L 23/538 (2006.01)
H01L 23/00 (2006.01)
H01L 21/56 (2006.01)
H01L 21/48 (2006.01)
H01L 21/683 (2006.01)
H01L 21/3105 (2006.01)
H01L 23/498 (2006.01)
H01L 25/065 (2006.01)

(52) U.S. Cl.
CPC ........ *H01L 21/4857* (2013.01); *H01L 21/565* (2013.01); *H01L 21/568* (2013.01); *H01L 21/6835* (2013.01); *H01L 23/3114* (2013.01); *H01L 23/3135* (2013.01); *H01L 23/49816* (2013.01); *H01L 23/5383* (2013.01); *H01L 23/5386* (2013.01); *H01L 24/05* (2013.01); *H01L 24/16* (2013.01); *H01L 24/81* (2013.01); *H01L 24/82* (2013.01); *H01L 25/0655* (2013.01); *H01L 25/18* (2013.01); *H01L 24/32* (2013.01); *H01L 24/73* (2013.01); *H01L 2221/68345* (2013.01); *H01L 2224/05124* (2013.01); *H01L 2224/16227* (2013.01); *H01L 2224/32225* (2013.01); *H01L 2224/73204* (2013.01); *H01L 2924/143* (2013.01); *H01L 2924/1434* (2013.01); *H01L 2924/15174* (2013.01); *H01L 2924/3511* (2013.01)

(58) Field of Classification Search
CPC ... H01L 24/14; H01L 23/5226; H01L 23/528; H01L 21/4853; H01L 24/82; H01L 23/3114; H01L 21/565; H01L 21/568; H01L 23/3135; H01L 23/5386
See application file for complete search history.

(56) References Cited

U.S. PATENT DOCUMENTS

| 9,257,401 | B2 | 2/2016 | Hsu et al. | |
| 10,026,668 | B1* | 7/2018 | Lee | H01L 24/82 |
| 2003/0189261 | A1 | 10/2003 | Tong et al. | |
| 2011/0254156 | A1 | 10/2011 | Lin | |
| 2013/0008705 | A1 | 1/2013 | Tseng et al. | |
| 2014/0124928 | A1 | 5/2014 | Lin et al. | |
| 2015/0187715 | A1 | 7/2015 | Hart et al. | |
| 2015/0380334 | A1* | 12/2015 | Hu | H01L 23/36 257/712 |
| 2016/0027747 | A1 | 1/2016 | Ryu et al. | |
| 2016/0086902 | A1* | 3/2016 | Lu | H01L 24/14 257/737 |
| 2016/0225729 | A1 | 8/2016 | Chen et al. | |
| 2017/0236802 | A1 | 8/2017 | Hsieh et al. | |

OTHER PUBLICATIONS

Office Action issued in Korean Application No. 10-2017-0085042 dated Nov. 22, 2018, with English translation.

* cited by examiner

US 10,347,556 B2

PASSIVATION LAYER HAVING OPENING FOR UNDER BUMP METALLURGY

CROSS-REFERENCE TO RELATED APPLICATION(S)

This application is a Continuation of U.S. patent application Ser. No. 15/802,170, filed on Nov. 2, 2017, which claims benefit of priority to Korean Patent Application No. 10-2017-0085042 filed on Jul. 4, 2017 in the Korean Intellectual Property Office, the disclosure of which are incorporated herein by reference in their entirety.

TECHNICAL FIELD

The present disclosure relates to a semiconductor device and a method for manufacturing the same.

BACKGROUND

In accordance with improvements in the specifications of sets and the use of a high bandwidth memory, the market for die to die interposers has grown. Currently, silicon is mainly used as a material of an interposer, but development of a glass or organic manner has been conducted in order to increase an area and reduce costs. A connecting portion connecting the interposer to a main board, or the like, of the set, is known as an under bump metallurgy (UBM) layer, and as reliability of the connecting portion is significantly affected by a structure of the UBM layer, the structure of the UBM layer needs to be optimized.

In the interposer according to the related art, a redistribution layer (RDL) is formed, a die is attached to the RDL, a package process of molding the die is performed, a package is separated from a carrier, and the UBM layer is formed on a lower surface of the package in contact with the carrier by processes such as a process of forming vias, an exposing process, a plating process, and the like. However, in this case, it is difficult to perform a process due to warpage in the package. Therefore, a separate carrier needs to further be used, and a dedicated line for a process of forming the UBM layer needs to be built up. In addition, products passing through a package line having a low degree of cleanliness again pass through the exposing process and the plating process having a high degree of cleanliness, and a risk of process quality, a risk of a yield reduction, or the like, thus exists.

SUMMARY

An aspect of the present disclosure may provide a semiconductor device having an under bump metallurgy (UBM) layer able to be formed through a simplified process and securing high reliability.

According to an aspect of the present disclosure, a semiconductor device may be provided, in which portions of UBM pads are embedded in a passivation layer in a final package structure by changing a UBM layer final method according to the related art into a UBM layer first method to form a UBM layer before a redistribution layer of a connection member is formed.

According to an aspect of the present disclosure, a semiconductor device may include: a semiconductor chip having an active surface having connection pads disposed thereon; an encapsulant encapsulating at least portions of the semiconductor chip; a connection member disposed on the active surface of the semiconductor chip and including a redistribution layer electrically connected to the connection pads; a passivation layer disposed on the connection member; and a UBM layer at least partially embedded in the passivation layer and electrically connected to the redistribution layer of the connection member. The UBM layer includes a UBM pad partially embedded in the passivation layer and a UBM via penetrating through a portion of the passivation layer and electrically connecting the redistribution layer of the connection member and the UBM pad to each other. A portion of a side surface of the UBM pad is exposed through a first opening that is formed in the passivation layer and surrounds the UBM pad. A lower surface of the UBM layer is exposed through the passivation layer.

According to another aspect of the present disclosure, a semiconductor device may include: a semiconductor chip having an active surface having connection pads disposed thereon; an encapsulant encapsulating at least portions of the semiconductor chip; a connection member disposed on the active surface of the semiconductor chip and including a redistribution layer electrically connected to the connection pads; a passivation layer disposed on the connection member; UBM pads at least partially embedded in the passivation layer; UBM vias penetrating through at least portions of the passivation layer and electrically connecting the redistribution layer of the connection member and the UBM pads to each other; and connection terminals covering at least portions of the UBM pads. A width of an upper surface of each UBM via in contact with the redistribution layer of the connection member is greater than that of a lower surface thereof in contact with a respective UBM pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

In the present disclosure, terms "lower side", "lower portion", "lower surface", and the like, have been used to indicate a direction toward a mounted surface of the semiconductor device in relation to cross sections of the drawings, terms "upper side", "upper portion", "upper surface", and the like, have been used to indicate an opposite direction to the direction indicated by the terms "lower side", "lower portion", "lower surface", and the like. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another.

For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
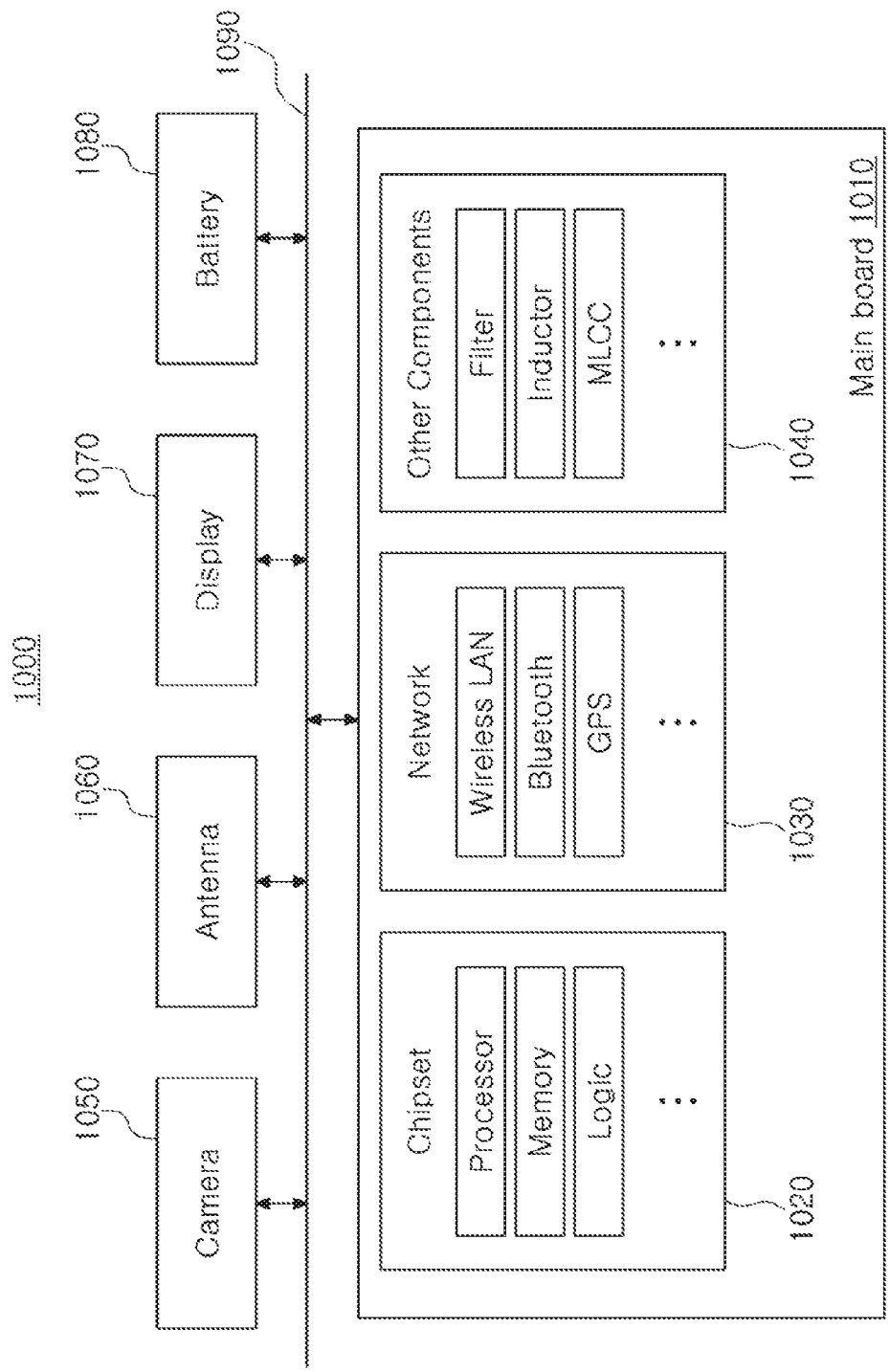
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, further components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Further components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, further components 1040 are not limited thereto, but may also include passive components used for various other purposes, or the like. In addition, further components 1040 may be combined with each other, together with the chip related components 1020 or the network related components 1030 described above.

Depending on a type of the electronic device 1000, the electronic device 1000 may include further components that may or may not be physically or electrically connected to the main board 1010. These further components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these further components are not limited thereto, but may also include further components used for various purposes depending on a type of electronic device 1000, or the like.

The electronic device 1000 maybe a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
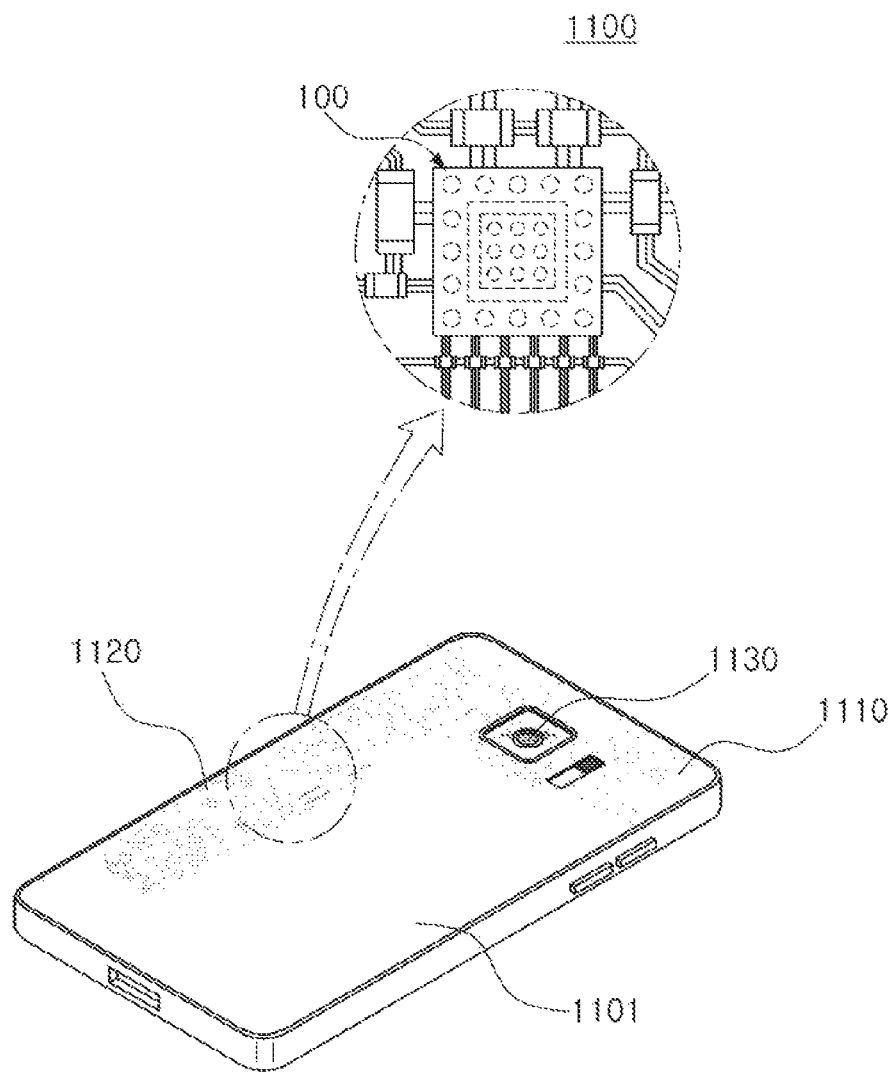
FIG. 2 is a schematic perspective view illustrating an example of an electronic device.

FIG. 2 is a schematic perspective view illustrating an example of an electronic device.

Referring to FIG. 2, a semiconductor device may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, further components that may or may not be physically or electrically connected to the motherboard 1110, such as a camera module 1130, may be accommodated in the body 1101. Some of the electronic components 1120 may be the chip related components, and the semiconductor device 100 may be, for example, an application processor among the chip related components, but is not limited thereto. The electronic device is not necessarily limited to the smartphone 1100, but may be other electronic devices as described above.

Semiconductor Device

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor device manufactured by the packaging technology may be classified as a fan-in semiconductor device or a fan-out semiconductor device depending on a structure and a purpose thereof.

The fan-in semiconductor device and the fan-out semiconductor device will hereinafter be described in more detail with reference to the drawings.

Fan-In Semiconductor Device

Figure 3B:
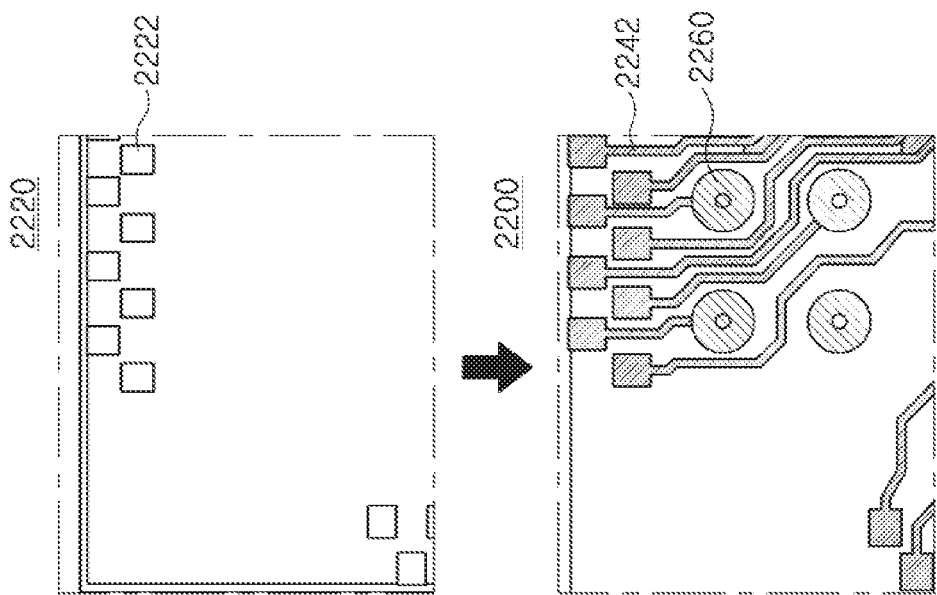
FIGS. 3A and 3B are schematic cross-sectional views illustrating states of a fan-in semiconductor device before and after being packaged.
Figure 3A:
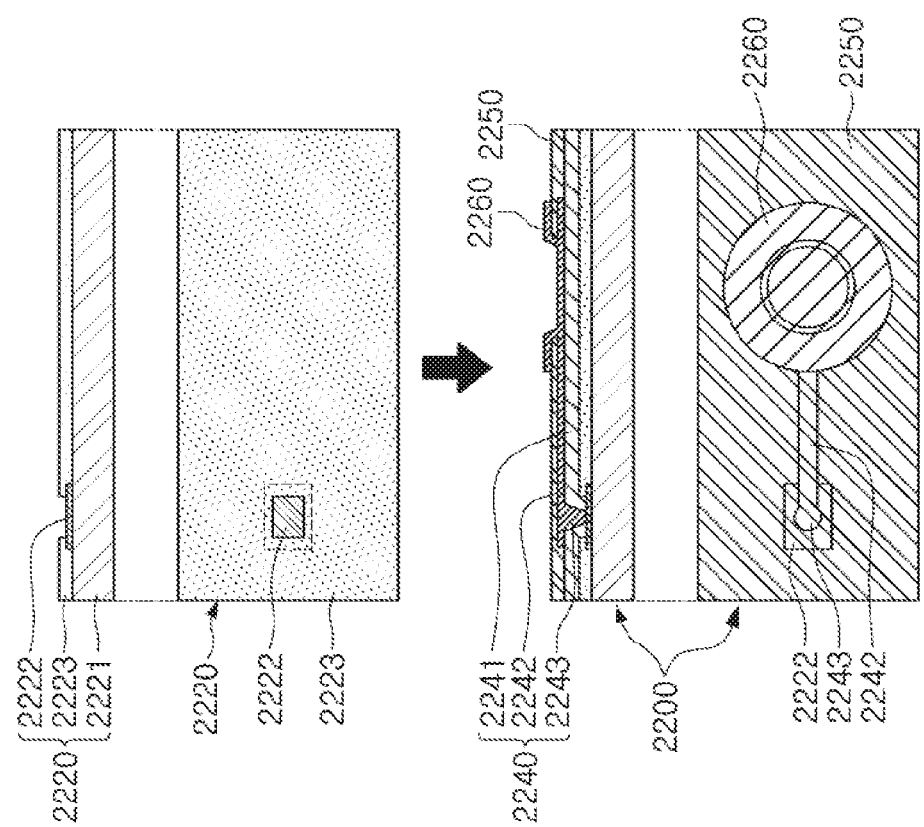

FIGS. 3A and 3B are schematic cross-sectional views illustrating states of a fan-in semiconductor device before and after being packaged.

Figure 4:
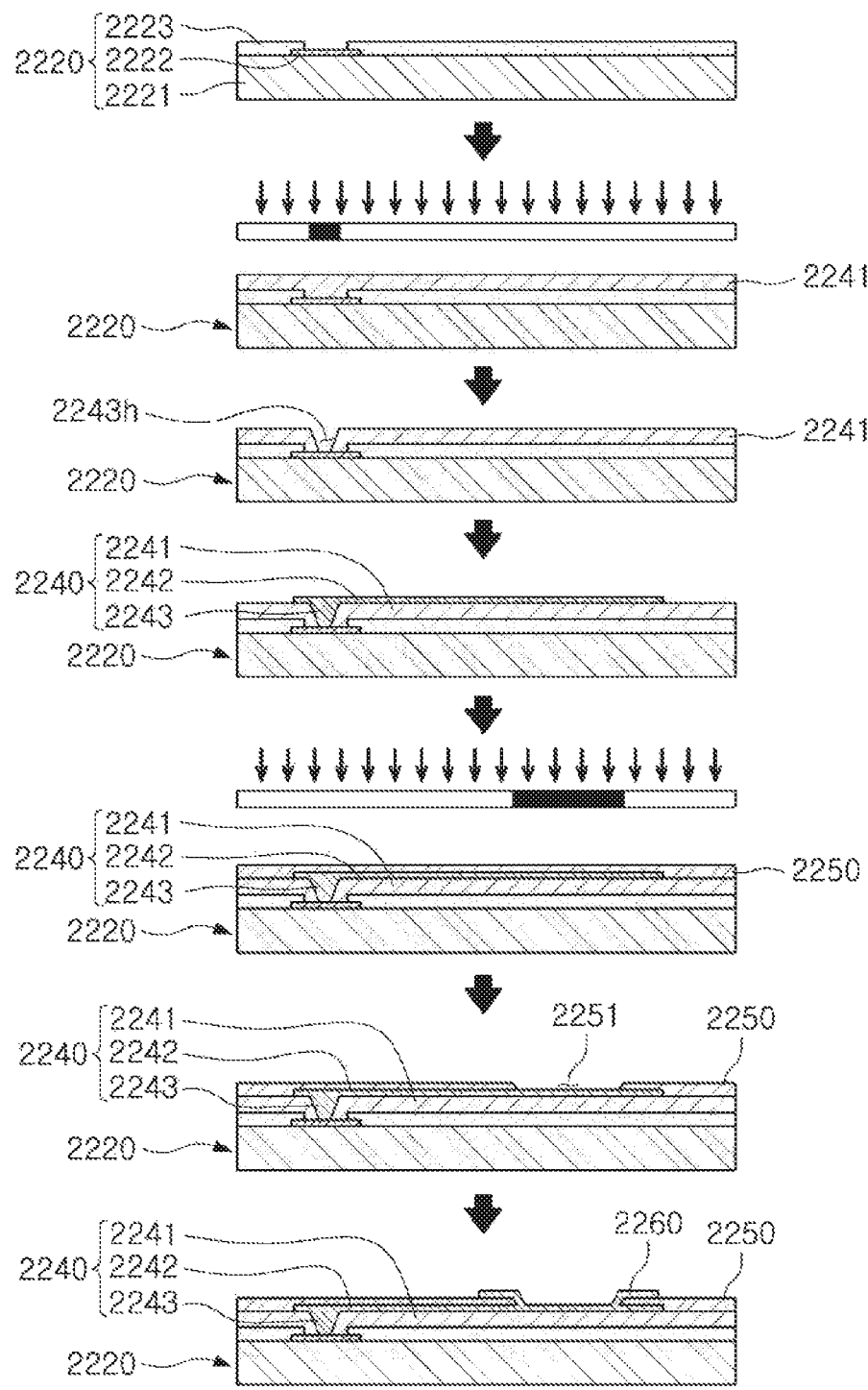
FIG. 4 is schematic cross-sectional views illustrating a packaging process of a fan-in semiconductor device.

FIG. 4 is schematic cross-sectional views illustrating a packaging process of a fan-in semiconductor device.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an under bump metallurgy (UBM) layer 2260, or the like, may be formed. That is, a fan-in semiconductor device 2200 including, for example, the semiconductor chip 2220, the connection member 2240, the passivation layer 2250, and the UBM layer 2260 may be manufactured through a series of processes.

As described above, the fan-in semiconductor device may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor device form. In detail, many elements mounted in smartphones have been developed to implement a rapid signal transfer while having a compact size.

However, since all I/O terminals need to be disposed inside the semiconductor chip in the fan-in semiconductor device, the fan-in semiconductor device has a high spatial limitation. Therefore, it is difficult to apply this structure to a semiconductor chip having a large number of I/O terminals or a semiconductor chip having a compact size. In addition, due to the disadvantage described above, the fan-in semiconductor device may not be directly mounted and used on the main board of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor device on the main board of the electronic device.

Figure 5:
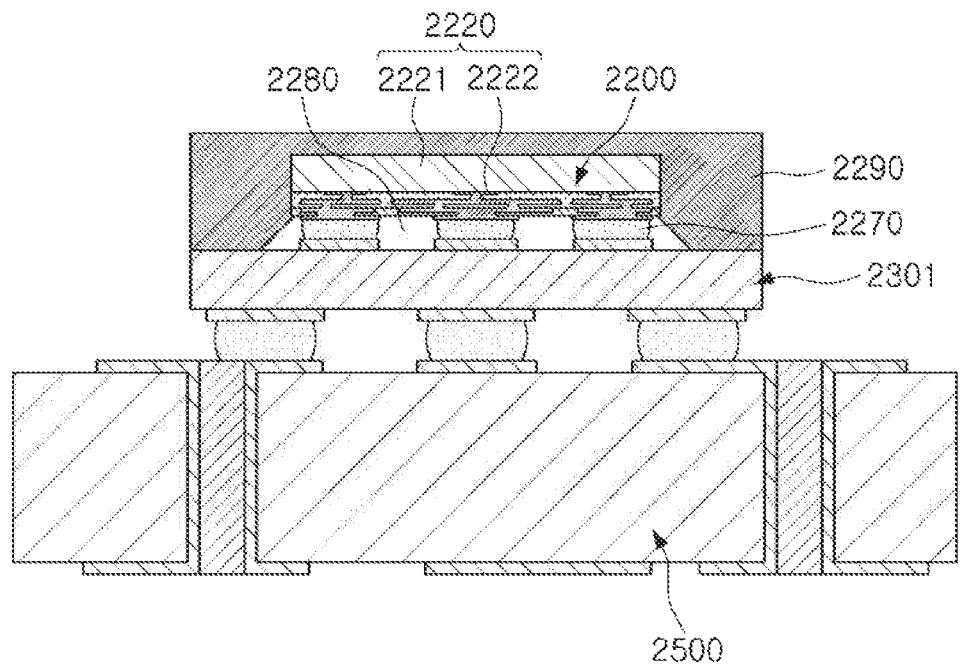
FIG. 5 is a schematic cross-sectional view illustrating a case in which a fan-in semiconductor device is mounted on an interposer substrate and is ultimately mounted on a main board of an electronic device.

FIG. 5 is a schematic cross-sectional view illustrating a case in which a fan-in semiconductor device is mounted on an interposer substrate and is ultimately mounted on a main board of an electronic device.

Figure 6:
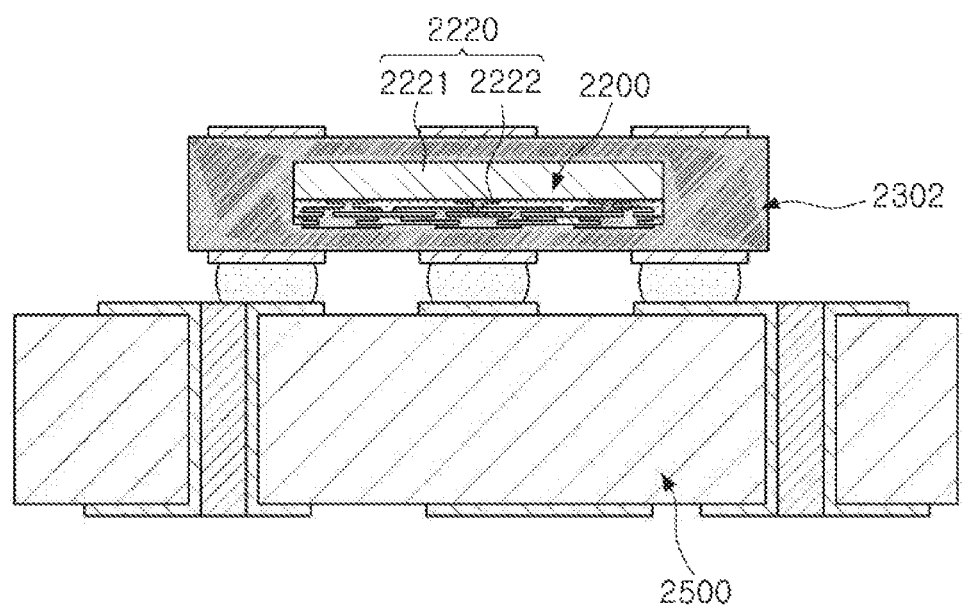
FIG. 6 is a schematic cross-sectional view illustrating a case in which a fan-in semiconductor device is embedded in an interposer substrate and is ultimately mounted on a main board of an electronic device.

FIG. 6 is a schematic cross-sectional view illustrating a case in which a fan-in semiconductor device is embedded in an interposer substrate and is ultimately mounted on a main board of an electronic device.

Referring to the drawings, in a fan-in semiconductor device 2200, connection pads 2222, that is, I/O terminals, of a semiconductor chip 2220 may be redistributed through an interposer substrate 2301, and the fan-in semiconductor device 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor device 2200 may be embedded in a separate interposer substrate 2302, connection pads 2222, that is, I/O terminals, of the semiconductor chip 2220 may be redistributed by the interposer substrate 2302 in a state in which the fan-in semiconductor device 2200 is embedded in the interposer substrate 2302, and the fan-in semiconductor device 2200 may be ultimately mounted on a main board 2500 of an electronic device.

As described above, it may be difficult to directly mount and use the fan-in semiconductor device on the main board of the electronic device. Therefore, the fan-in semiconductor device may be mounted on the separate interposer substrate and be then mounted on the main board of the electronic device through a packaging process or may be mounted and used on the main board of the electronic device in a state in which it is embedded in the interposer substrate.

Fan-Out Semiconductor Device

Figure 7:
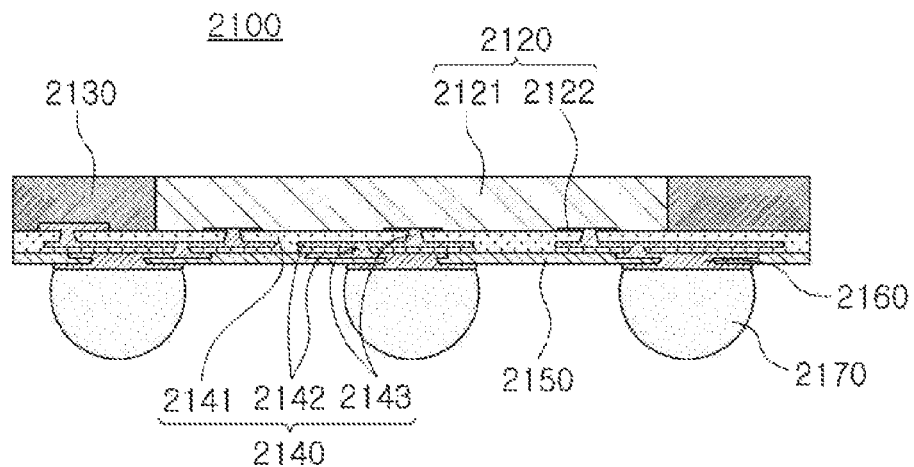
FIG. 7 is a schematic cross-sectional view illustrating a fan-out semiconductor device.

FIG. 7 is a schematic cross-sectional view illustrating a fan-out semiconductor device.

Referring to the drawing, in a fan-out semiconductor device 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and a UBM layer 2160 may be further formed in openings of the passivation layer 2150. Solder balls 2170 may be further formed on the UBM layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor device may have a form in which I/O terminals of the semiconductor chip are redistributed and disposed outwardly of the semiconductor chip through the connection member formed on the semiconductor chip. As described above, in the fan-in semiconductor device, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor device. On the other hand, the fan-out semiconductor device has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor device as it is, such that the fan-out semiconductor device may be mounted on the main board of the electronic device without using a separate interposer substrate, as described below.

Figure 8:
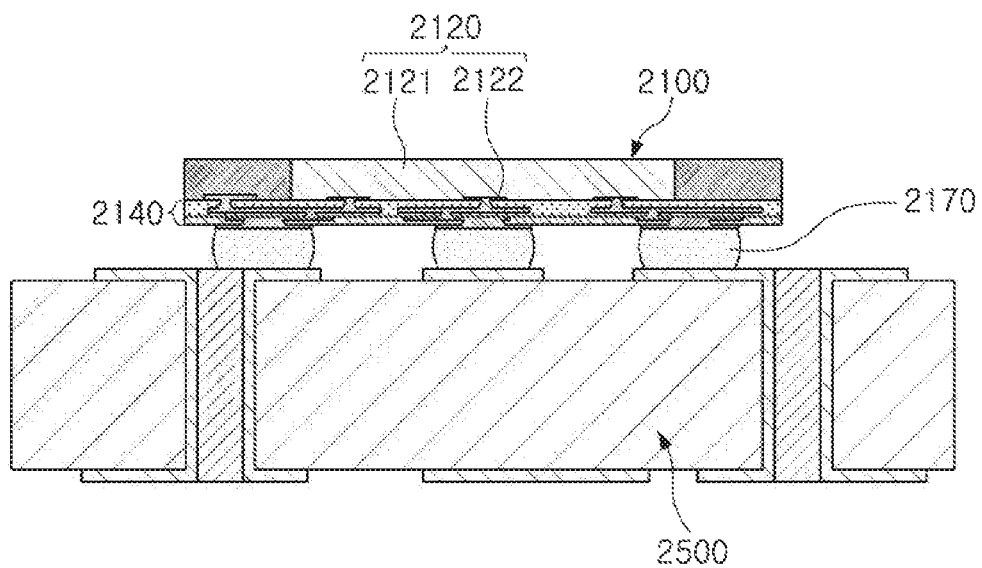
FIG. 8 is a schematic cross-sectional view illustrating a case in which a fan-out semiconductor device is mounted on a main board of an electronic device.

FIG. 8 is a schematic cross-sectional view illustrating a case in which a fan-out semiconductor device is mounted on a main board of an electronic device.

Referring to the drawing, a fan-out semiconductor device 2100 may be mounted on a main board 2500 of an electronic device through solder balls 2170, or the like. That is, as described above, the fan-out semiconductor device 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor device 2100 as it is. As a result, the fan-out semiconductor device 2100 may be mounted on the main board 2500 of the electronic device without using a separate interposer substrate, or the like.

As described above, since the fan-out semiconductor device may be mounted on the main board of the electronic device without using the separate interposer substrate, the fan-out semiconductor device may be implemented at a thickness lower than that of the fan-in semiconductor device using the interposer substrate. Therefore, the fan-out semiconductor device may be miniaturized and thinned. In addition, the fan-out semiconductor device has excellent thermal characteristics and electrical characteristics, such that it is particularly appropriate for a mobile product. Therefore, the fan-out semiconductor device may be implemented in a form more compact than that of a general package-on-package (POP) type using a printed circuit board (PCB), and may solve a problem due to occurrence of a warpage phenomenon.

A fan-out semiconductor device having a structure of a UBM layer capable of having a simplified process and securing high reliability will hereinafter be described.

Figure 9:
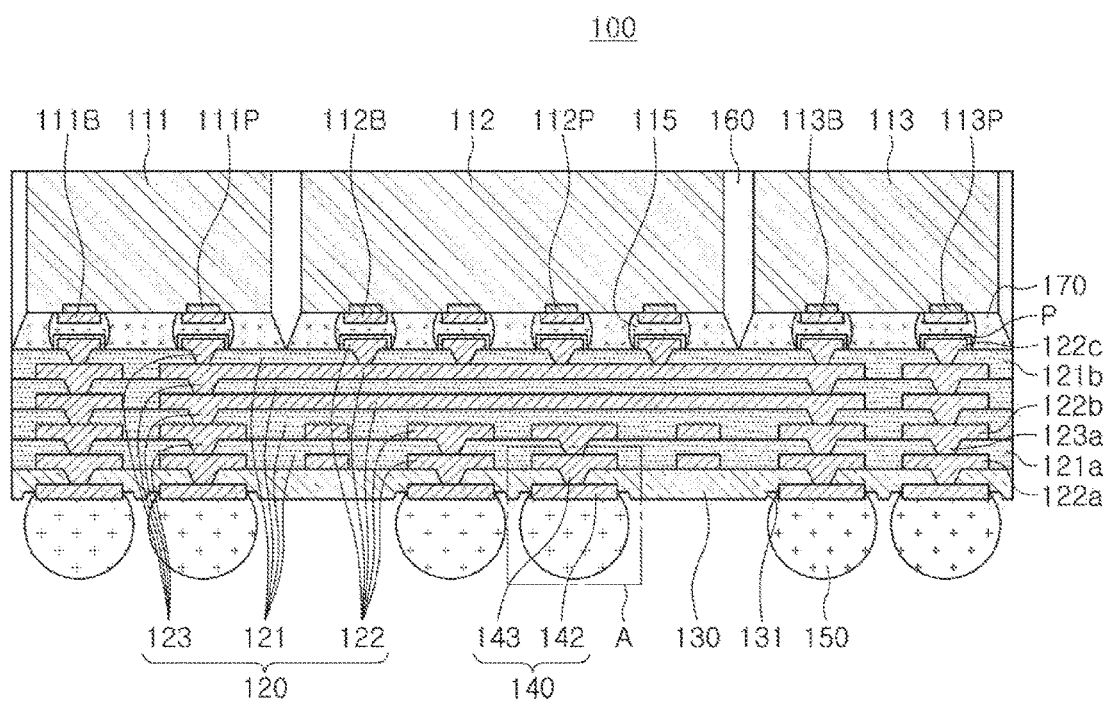
FIG. 9 is a schematic cross-sectional view illustrating an example of a semiconductor device.

FIG. 9 is a schematic cross-sectional view illustrating an example of a semiconductor device.

Figure 10A:
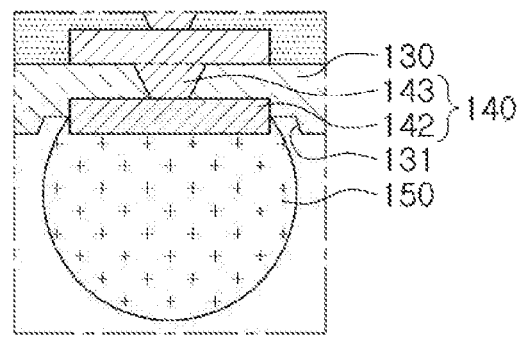
FIG. 10A is a schematic enlarged cross-sectional view illustrating region A of the semiconductor device of FIG. 9.

FIG. 10A is a schematic enlarged cross-sectional view illustrating region A of the semiconductor device of FIG. 9.

Referring to the drawings, a semiconductor device 100 according to an exemplary embodiment in the present disclosure may include semiconductor chips 111, 112, and 113 having active surfaces having connection pads 111P, 112P, and 113P disposed thereon, respectively, an encapsulant 160 encapsulating at least portions of the semiconductor chips 111, 112, and 113, a connection member 120 disposed on the active surfaces of the semiconductor chips 111, 112, and 113 and including redistribution layers 122 electrically connected to the respective connection pads 111P, 112P, and 113P, a passivation layer 130 disposed on the connection member 120, a UBM layer 140 at least partially embedded in the passivation layer 130 and electrically connected to the redistribution layer 122 of the connection member 120, and connection terminals 150 connected to the UBM layer 140.

The UBM layer 140 may include UBM pads 142 at least partially embedded in the passivation layer 130 and UBM vias 143 embedded in the passivation layer 130 and electrically connecting the redistribution layer 122 of the connection member 120 and the UBM pads 142 to each other. The passivation layer 130 may have openings 131 surrounding the UBM pads 142 and exposing at least portions of side surfaces of the UBM pads 142. A lower surface of the passivation layer 130 may be disposed on a level that is the same as or substantially the same as that of a lower surface of the UBM pads 142. The same level means that the lower surface of the passivation layer 130 and the lower surfaces of the UBM pads 142 are coplanar with each other. Substantially the same level means that the surface of the passivation layer 130 and the surfaces of the UBM pads 142 are coplanar with each other, when a flexion, or the like, if existing due to some processes or measurements, is ignored. The UBM pads 142 may have protruding portions protruding in the openings 131 of the passivation layer 130. Side surfaces of the protruding portions of the UBM pads, that is, the opened side surfaces of the UBM pads may be spaced apart from sidewalls of the openings 131. The connection terminals 150 may cover the lower surfaces and the opened side surfaces of the UBM pads 142.

Meanwhile, as described above, in the interposer according to the related art, a redistribution layer is formed on an insulating layer, a die is attached to the redistribution layer, a package process of molding the die is performed, a package is separated from a carrier, and a UBM layer is formed on a lower surface of the package in contact with the carrier by processes such as a process of forming vias, an exposing process, a plating process, and the like. Such a method according to the related art is generally called a UBM layer final method since the UBM layer is last formed. In the UBM layer final method, it is difficult to perform a process to form, for example, the UBM layer, due to warpage in the package. Therefore, a separate carrier needs to further be used, and a dedicated line for a process of forming the UBM layer needs to be built up. In addition, products passing through a package line having low cleanliness again pass through the exposing process and the plating process having high cleanliness, and a risk of process quality, a risk of a yield reduction, or the like, thus exists. Generally, in a case in which the UBM layer final method is used, UBM pads are formed on a passivation layer, and UBM vias are formed along via holes formed in the passivation layer.

Meanwhile, the semiconductor device 100 according to the exemplary embodiment may be manufactured by a UBM layer first method as seen from processes to be described below. That is, the UBM layer 140 and the passivation layer 130 may be formed on a line forming the connection member 120 before the connection member 120 is formed. Therefore, an additional carrier may not be required, the dedicated line for forming the UBM layer may be omitted, and a risk due to foreign materials after a package process may be lowered. In this process, the UBM layer 140 may be embedded in the passivation layer 130. In a subsequent process after the manufacture of the package is completed, the openings 131 may be formed in the passivation layer 130 to surround the UBM pads 142, and at least portions of the side surfaces the UBM pads 142 may be opened by the openings 131. That is, the at least portions of the side surfaces of the UBM pads 142 may be opened. The connection terminals 150 may cover the lower surfaces and the exposed side surfaces of the UBM pads 142 to thus have excellent connection reliability.

Meanwhile, in the semiconductor device 100 according to the exemplary embodiment, a width of an upper surface of the UBM via 143 in contact with the redistribution layer 122 of the connection member 120 may be greater than that of a lower surface thereof in contact with the UBM pad 142. Here, the width is decided in relation to a cross-sectional view. In a case in which the UBM layer final method is used as in the related art, a width of an upper surface of the UBM via is generally smaller than that of a lower surface thereof. On the other hand, in the semiconductor device 100 according to the exemplary embodiment, the UBM layer first method is used, and the UBM via 143 may thus be formed in a reverse trapezoidal shape in which the width of the upper surface thereof is greater than that of the lower surface thereof. In addition, since the UBM pads 142 and the UBM vias 143 are formed in the same manner as the redistribution layers 122 and vias 123 of the connection member 120, the UBM pads 142 may have an approximately block cross-sectional shape, and the
UBM vias 143 may be basically filled-vias.

The respective components included in the semiconductor device 100 according to the exemplary embodiment will hereinafter be described in more detail.

Each of the semiconductor chips 111, 112, and 113 may be, for example, a processor chip such as a central processor (for example, a CPU), a graphic processor (for example, a GPU), a field programmable gate array (FPGA), a digital signal processor, a cryptographic processor, a micro processor, a micro controller, or the like, be a logic chip such as an analog-to-digital converter, an application-specific IC (ASIC), or the like, or be a memory chip such as a volatile memory (for example, a DRAM), a non-volatile memory (for example, a ROM), a flash memory, a high bandwidth memory (HBM), or the like. In addition, the abovementioned elements may also be combined with each other and be disposed. As a non-restrictive example, a first semiconductor chip 111 and a third semiconductor chip 113 may be a memory chip such as an HBM, or the like, and a second semiconductor chip 112 may be a processor chip such as an AP. However, the number and/or functions of first to third semiconductor chips 111 to 113 are not limited thereto. The semiconductor device 100 may include only one semiconductor chip, only two semiconductor chips, or more than three semiconductor chips.

The semiconductor chips 111, 112, and 113 may be an integrated circuit (IC) provided in an amount of several hundreds to several millions of elements or more integrated in a single chip. In this case, a base material of each of bodies of the semiconductor chips may be silicon (Si), germanium (Ge), gallium arsenide (GaAs), or the like. Various circuits may be formed on each of the bodies. The connection pads 111P, 112P, and 113P of the semiconductor chips 111, 112, and 113 may electrically connect the semiconductor chips 111, 112, and 113 to further components. A material of each of the connection pads 111P, 112P, and 113P may be a conductive material such as aluminum (Al), or the like. A passivation layer exposing the connection pads 111P, 112P, and 113P may be formed on each of the bodies, and may be an oxide film, a nitride film, or the like, or a double layer of an oxide layer and a nitride layer. An insulating layer, and the like, may also be further disposed in required positions. Redistribution layers may be further formed on the active surfaces of the semiconductor chips 111, 112, and 113, if necessary, and bumps 111B, 112B, and 113B, or the like, may also be connected to the connection pads 111P, 112P, and 113P, respectively. The bumps 111B, 112B, and 113B may be formed of a metal or a solder. The semiconductor chips 111, 112, and 113 may be connected to an exposed upper redistribution layer 122c of the connection member 120 through the connection pads 111P, 112P, and 113P and/or the bumps 111B, 112B, and 113B, and connection members 115 such as solders, or the like, may be used for the connection. The respective semiconductor chips 111, 112, and 113 may be fixed onto the connection member 120 by an underfill resin 170.

The connection member 120 may redistribute the connection pads 111P, 112P, and 113P of the semiconductor chips 111, 112, and 113. Several tens to several hundreds of connection pads 111P, 112P, and 113P of each of the semiconductor chips 111, 112, and 113 having various functions may be redistributed by the connection member 120, and may be physically or electrically connected to an external source through the connection terminals 150 depending on the functions. The connection member 120 may include insulating layers 121, the redistribution layers 122 formed on or in the insulating layers 121, and the vias 123 penetrating through the insulating layers 121 and electrically connecting the redistribution layers 122 formed on different layers to each other. The number of layers of the connection member 120 may be more than that illustrated in the drawing or be less than that illustrated in the drawing. The connection member 120 having such a form may be used as a 2.5D interposer.

For example, an insulating material may be used as a material of each of the insulating layers 121. In this case, a thermosetting resin such as an epoxy resin, a thermoplastic resin such as a polyimide resin, a resin in which the thermosetting resin and the thermoplastic resin are mixed with an inorganic filler, for example, Ajinomoto build-up film (ABF), or the like, may be used as the insulating material. Alternatively, a photosensitive insulating material such as a photoimagable dielectric (PID) resin may be used the insulating material. That is, each of the insulating layers 121 may be a photosensitive insulating layer. When the insulating layers 121 have photosensitive properties, the insulating layers 121 may be formed to have a smaller thickness, and a fine pitch of the vias 123 may be achieved more easily. When the insulating layers 121 are multiple layers, materials of the insulating layers 121 may be the same as each other, and may also be different from each other, if necessary. When the insulating layers 121 are the multiple layers, the insulating layers 121 may be integrated with each other depending on a process, such that a boundary therebetween may also not be apparent.

The redistribution layers 122 may serve to substantially redistribute the connection pads 111P, 112P, and 113P. A material of each of the redistribution layers 122 may be a conductive material such as copper (Cu), aluminum (Al), silver (Ag), tin (Sn), gold (Au), nickel (Ni), lead (Pb), titanium (Ti), or alloys thereof. The redistribution layers 122 may perform various functions depending on designs of their corresponding layers. For example, the redistribution layers 122 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 122 may include via pads, connection terminal pads, and the like.

The vias 123 may electrically connect the redistribution layers 122 formed on different layers to each other, resulting in an electrical path in the semiconductor device 100. A material of each of the vias 123 may be a conductive material such as copper (Cu), aluminum (Al), silver (Ag), tin (Sn), gold (Au), nickel (Ni), lead (Pb), titanium (Ti), or alloys thereof. The vias 123 may be completely filled with a conductive material, but are not limited thereto.

The connection member 120 may include a first insulating layer 121a in contact with the passivation layer 130, a first redistribution layer 122a embedded in the first insulating layer 121a and in contact with the passivation layer 130 and the UBM vias 143, a second redistribution layer 122b disposed on the first insulating layer 121a, and first vias 123a penetrating through at least portions of the first insulating layer 121a and electrically connecting the first redistribution layer 122a and the second redistribution layer 122b to each other. The connection member 120 may be formed by configuring insulating layers, redistribution layers, and vias having such a form as multiple layers. A width of an upper surface of the first via 123a in contact with the second redistribution layer 122b may be greater than that of a lower surface thereof in contact with the first redistribution layer 122a. That is, a cross-sectional shape of the via 123 of the connection member 120 may be substantially the same as that of the UBM via 143. That is, the cross-sectional shape of the via 123 may be an approximately reverse trapezoidal shape.

The connection member 120 may include a second insulating layer 121b in contact with the encapsulant 160 and/or the underfill resin 170 and a third redistribution layer 122c disposed on the second insulating layer 121b. The third redistribution layer 122c may be formed in a protruding form on an upper surface of the second insulating layer 121b, which is the uppermost insulating layer of the connection member 120. The third redistribution layer 122c may serve as pads for mounting the semiconductor chips 111, 112, and 113. A surface treatment layer P may be formed on a surface of the third redistribution layer 122c. The surface treatment layer P is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto. The third redistribution layer 122c and/or the surface treatment layer P may be connected to the connection pads 111P, 112P, and 113P and/or the bumps 111B, 112B, and 113B of the semiconductor chips 111, 112, and 113 through the connection members 115 such as the solders, or the like.

The passivation layer 130 may protect the connection member 120 from external physical or chemical damage. A material of the passivation layer 130 is not particularly limited. For example, an insulating material may be used as the material of the passivation layer 130. In this case, the insulating material may be the material described as the insulating material of the insulating layer 121 of the connection member 120 described above, for example, the ABF. The passivation layer 130 may have the openings 131 surrounding the UBM pads 142 and opening at least portions of the side surfaces of the UBM pads 142. The side surfaces of the UBM pads 142 may be exposed through the openings 131, such that that connection reliability between the UBP pads 142 and the connection terminals 150 may be improved. A lower surface of the passivation layer 130 may be disposed on a level that is the same or substantially the same as that of the lower surface of the UBM pad 142. The reason is that the UBM pads 142 are formed to be exposed to the surface of the passivation layer 130 and are then subjected to a grinding process, or the like, and the openings 131 are then formed in the passivation layer 130, as seen from processes to be described below. The same level means that the surface of the passivation layer 130 and the surface of the UBM pad 142 are coplanar with each other. Substantially the same level means that the lower surface of the passivation layer 130 and the lower surface of the UBM pads 142 are coplanar with each other, when a flexion, or the like, if existing due to some processes or measurements, is ignored.

The UBM layer 140 may improve connection reliability of the connection terminals 150, resulting in improvement of board level reliability of the semiconductor device 100. The UBM layer 140 may include the UBM pads 142 at least partially embedded in the passivation layer 130 and the UBM vias 143 penetrating through at least portions of the passivation layer 130 and electrically connecting the redistribution layer 122 of the connection member 120 and the UBM pads 142 to each other. The passivation layer 130 may have the openings 131 surrounding the UBM pads 142 and opening at least portions of the side surfaces of the UBM pads 142. The UBM pads 142 may have the protruding portions protruding in the openings 131 of the passivation layer 130. The side surfaces of the protruding portions may be spaced apart from the sidewalls of the openings 131. The connection terminals 150 may cover the opened surfaces and side surfaces of the UBM pads 142.

The width of the upper surface of the UBM via 143 in contact with the redistribution layer 122 of the connection member 120 may be greater than that of the lower surface thereof in contact with the UBM pad 142. Here, the width is decided in relation to a cross-sectional view. In a case in which the UBM layer final method is used as in the related art, a width of an upper surface of the UBM via is generally smaller than that of a lower surface thereof. On the other hand, in the semiconductor device 100 according to the exemplary embodiment, the UBM layer first method is used, and the UBM via 143 may thus be formed in a reverse trapezoidal shape in which the width of the upper surface thereof is greater than that of the lower surface thereof. In addition, since the UBM pads 142 and the UBM vias 143 are formed in the same manner as the redistribution layers 122 and vias 123 of the connection member 120, the UBM pads 142 may have an approximately block cross-sectional shape, and the UBM vias 143 may be basically filled-vias.

The connection terminals 150 may physically or electrically externally connect the semiconductor device 100. For example, the semiconductor device 100 may be mounted on the main board of the electronic device through the connection terminals 150. Each of the connection terminals 150 may be formed of a conductive material, for example, a solder, or the like. However, this is only an example, and a material of each of the connection terminals 150 is not particularly limited thereto.

Each of the connection terminals 150 may be a land, a ball, a pin, or the like. The connection terminals 150 may be formed as a multilayer or single layer structure. When the connection terminals 150 are formed as a multilayer structure, the connection terminals 150 may include a copper (Cu) pillar and a solder. When the connection terminals 150 are formed as a single layer structure, the connection terminals 150 may include a tin-silver solder or copper (Cu). However, this is only an example, and the connection terminals 150 are not limited thereto.

The number, an interval, a disposition, or the like, of the connection terminals 150 is not particularly limited, but may be sufficiently modified by a person skilled in the art depending on design particulars. For example, the connection terminals 150 may be provided in an amount of several tens to several thousands according to the numbers of connection pads 111P, 112P, and 113P, or may be provided in an amount of several tens to several thousands or more or several tens to several thousands or less. At least one of the connection terminals 150 may be disposed in a fan-out region. The fan-out region is a region except for a region in which the semiconductor chips 111, 112, and 113 are disposed.

That is, the semiconductor device 100 according to the exemplary embodiment may be a fan-out semiconductor device. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a low thickness, and may have price competitiveness.

The encapsulant 160 may protect the semiconductor chips 111, 112, and 113, and the like. An encapsulation form of the encapsulant 160 is not particularly limited, but may be a form in which the encapsulant 160 surrounds at least portions of the semiconductor chips 111, 112, and 113. A material of the encapsulant 160 is not particularly limited. For example, an insulating material may be used as the material of the encapsulant 160. In this case, a thermosetting resin such as an epoxy resin, a thermoplastic resin such as a polyimide resin, a resin in which the thermosetting resin and the thermoplastic resin are mixed with an inorganic filler, for example, ABF, or the like, may be used as the insulating material. However, the material of the encapsulant 160 is not limited thereto, but may also be prepreg, or the like, including a glass fiber. Alternatively, the known epoxy molding compound (EMC), or the like, may also be used as the material of the encapsulant 160.

The underfill resin 170 may fix the semiconductor chips 111, 112, and 113 onto the connection member 120. The known material including epoxy, or the like, may be used as a material of the underfill resin 170. The underfill resin 170 may be omitted, if necessary. Meanwhile, although not illustrated in the drawings, passive components may also be disposed and packaged in parallel with the semiconductor chips 111, 112, and 113 on the connection member 120, if necessary.

Figure 10B:
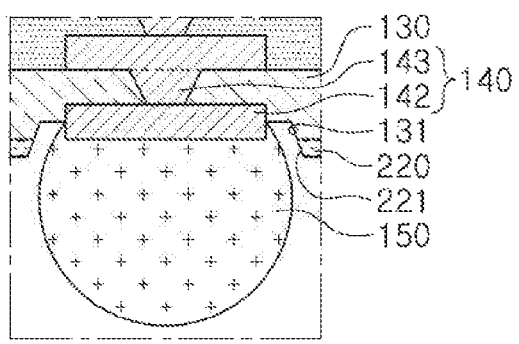
FIG. 10B is a schematic enlarged cross-sectional view illustrating a modified example of region A of FIG. 10A.

FIG. 10B is a schematic enlarged cross-sectional view of region A' illustrating a modified example of region A of FIG. 10A.

Referring to the drawing, a resin layer 220 may be further disposed on the passivation layer 130, and openings 221 extending from the openings 131 formed in the passivation layer 130 may be formed in the resin layer 220. The resin layer 220 may be formed for the purpose of insulation between the semiconductor device 100 and a carrier 210 when an electrical test is performed on the redistribution layers 122 after the connection member 120 is formed in processes to be described below, and may remain in a final product when it is not subjected to grinding, or the like. The resin layer 220 may be, for example, ABF including an insulating resin and an inorganic filler, but is not limited thereto. The resin layer 220 may be formed of the same material as that of the passivation layer 130. In this case, a boundary between the resin layer 220 and the passivation layer 130 may not be apparent, but is not limited thereto. A lower surface of the resin layer 220 may have a step with respect to the surface of the UBM pad 142.

Figure 11A:
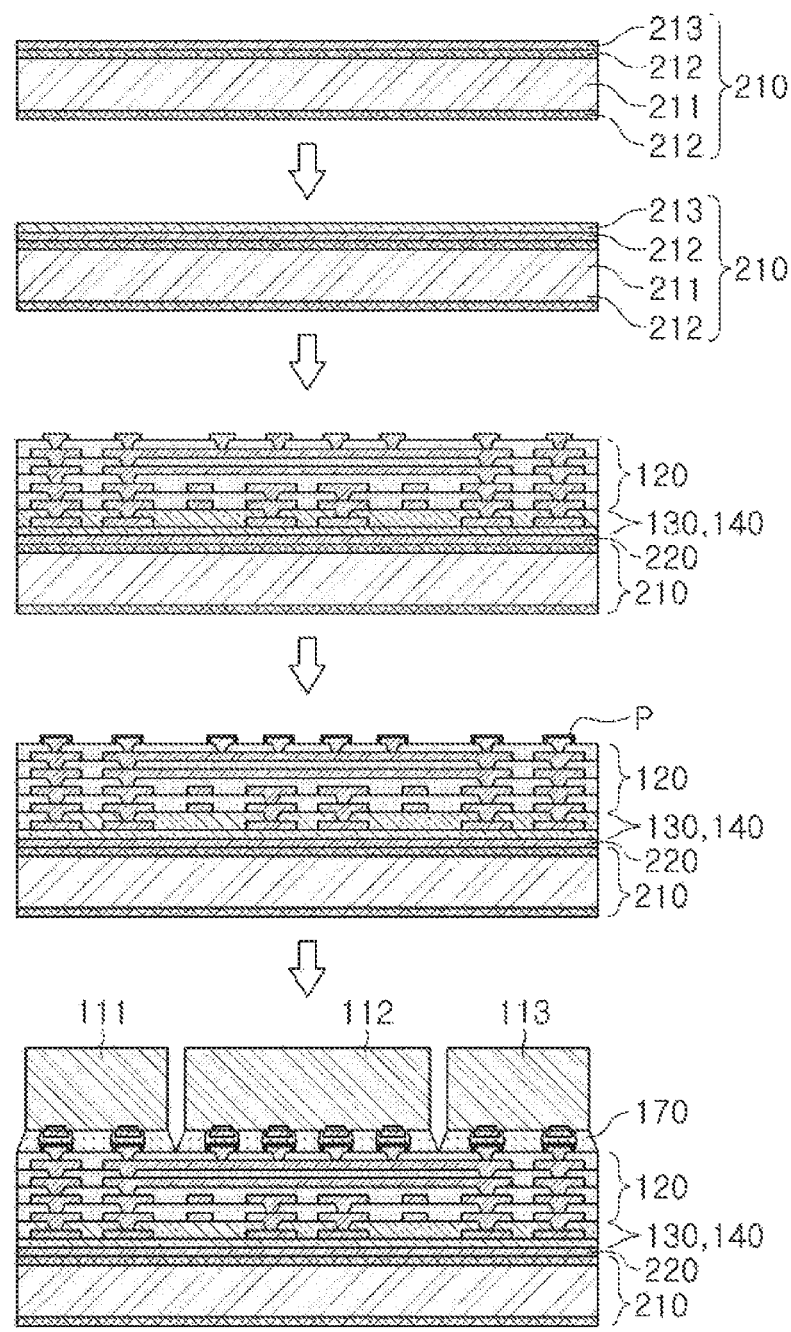
FIGS. 11A and 11B are schematic views illustrating an example of processes of manufacturing the semiconductor device of FIG. 9.
Figure 11B:
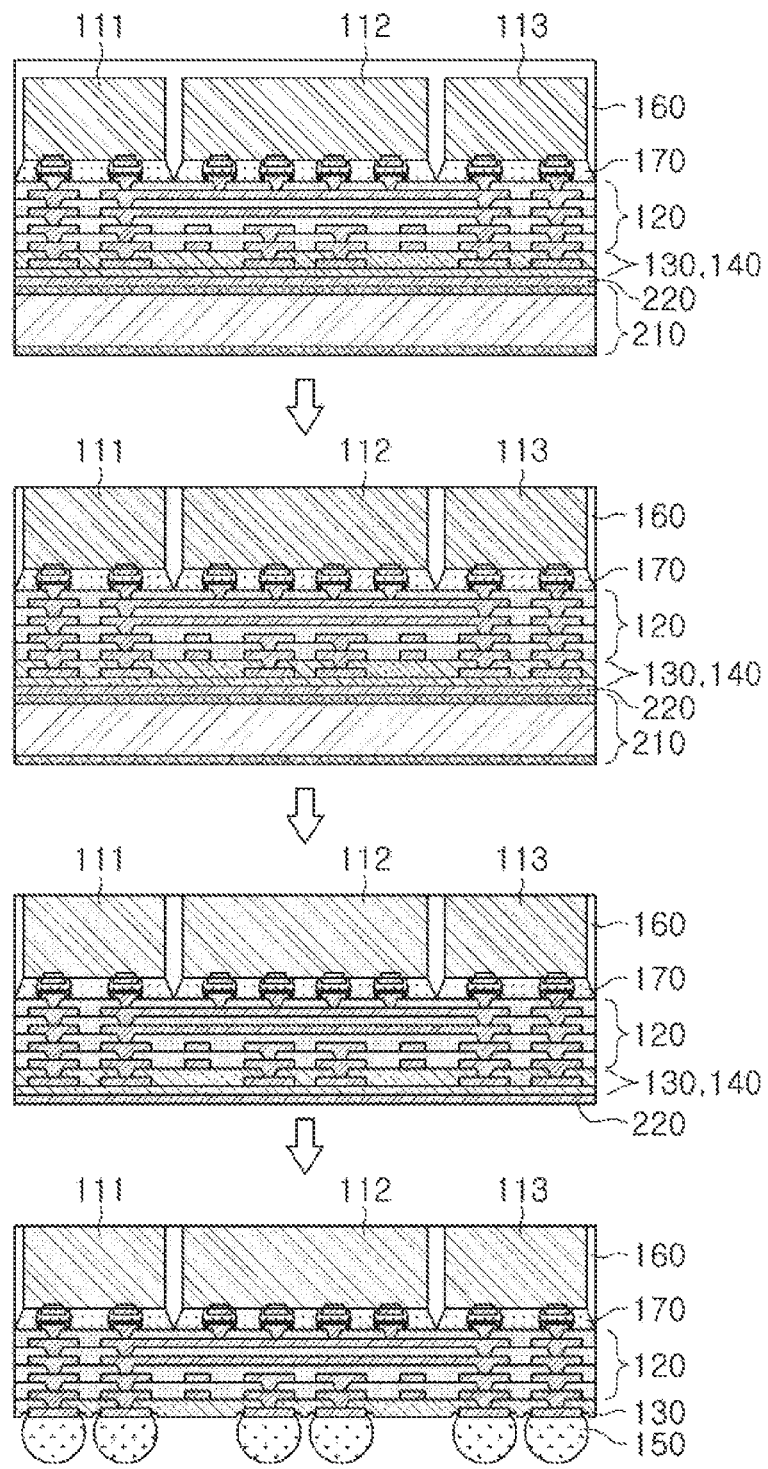

FIGS. 11A and 11B are schematic views illustrating an example of processes of manufacturing the semiconductor device of FIG. 9.

Referring to the drawing, the carrier 210 may be first prepared. The carrier 210 may include a core layer 211 and metal layers 212 on opposite sides of the core layer 211, and may further includes a metal layer 213 formed on one of the metal layers 212. The core layer 211 may be formed of, for example, prepreg including an insulating resin, an inorganic filler, and a glass fiber. The metal layers 212 and 213 may include a metal such as copper (Cu), titanium (Ti), or the like. Surface treatment may be performed between the metal layers 212 and 213 so that the metal layers 212 and 213 are easily separated from each other. Alternatively, a release layer may be provided between the metal layers 212 and 213. The carrier 210 may be a general detach core. Meanwhile, the resin layer 220 may be formed on the carrier 210, if necessary. The resin layer 220 may serve to electrically insulate between the carrier 210 and the manufactured semiconductor device 100. That is, the resin layer 220 may be used for the purpose of the insulation between the semiconductor device 100 and the carrier 210 when the electrical test is performed on the redistribution layers 122 of the connection member 120. The resin layer 220 may be formed by laminating a film form or applying or hardening a liquid phase form. The resin layer 220 may be, for example, ABF including an insulating resin and an inorganic filler, but is not limited thereto. The resin layer 220 may also be omitted.

Then, the passivation layer 130 and the UBM layer 140 may be formed, and the connection member 120 may be then formed. That is, the connection member 120, the passivation layer 130, and the UBM layer 140 may be formed on the same line. The UBM layer 140 may be formed by, for example, forming a seed layer on the resin layer 220, forming patterns using a dry film, or the like, filling the patterns using a plating process to form the UBM pads 142, covering the UBM pads 142 with the passivation layer 130, forming via holes in the passivation layer 130, and then filling the via holes using a plating process, or the like, to form the UBM vias 143. When the resin layer 220 is omitted, the UBM layer 140 may be formed using a second metal layer 213 of the carrier 210 as a seed layer. Meanwhile, when the UBM vias 143 are formed, the first redistribution layer 122a (shown in FIG. 9) of the connection member 120 may be formed on the passivation layer 130. That is, the UBM layer 140 and the redistribution layers 122 (shown in FIG. 9) and the vias 123 (shown in FIG. 9) of the connection member 120 may be continuously formed on the same line.

Then, the surface treatment layer P, or the like, may be formed on the third redistribution layer 122c (shown in FIG. 9) formed at an upper portion of the connection member 120. In addition, a quad route test, an electrical test of the redistribution layers 122, and the like, maybe performed. Then, the semiconductor chips 111, 112, and 113 may be mounted. The connection members 115 (shown in FIG. 9) such as the solders, or the like, may be used to mount the semiconductor chips 111, 112, and 113. Then, the semiconductor chips 111, 112, and 113 may be fixed by the underfill resin 170. Then, the encapsulant 160 encapsulating the semiconductor chips 111, 112, and 113 may be formed on the connection member 120. The encapsulant 160 may be formed by laminating a film form or applying or hardening a liquid phase form. Meanwhile, grinding may be performed on the encapsulant 160, if necessary. Upper surfaces of the semiconductor chips 111, 112, and 113 maybe disposed on the same level by the grinding. That is, thicknesses of the semiconductor chips 111, 112, and 113 may become substantially the same as each other.

Then, the carrier 210 may be separated. The carrier 210 may be separated by separating the metal layers 212 and 213 from each other. In this case, after separation, the metal layer 213 may be removed by an etching process. After the carrier 210 is removed, the resin layer 220 may be removed by grinding, or the like. However, when the resin layer 220 is omitted, the grinding may also be omitted. Then, the openings 131 may be formed in the passivation layer 130. The openings 131 may be formed so that at least portions of the side surfaces of the UBM pads 142 are exposed by processing the surroundings of the UBM pads 142 using a laser. After the openings 131 are formed, desmear processing, attachment of the connection terminals 150, a reflow, and the like, may be performed. The semiconductor device 100 according to the exemplary embodiment may be manufactured through a series of processes.

Figure 12A:
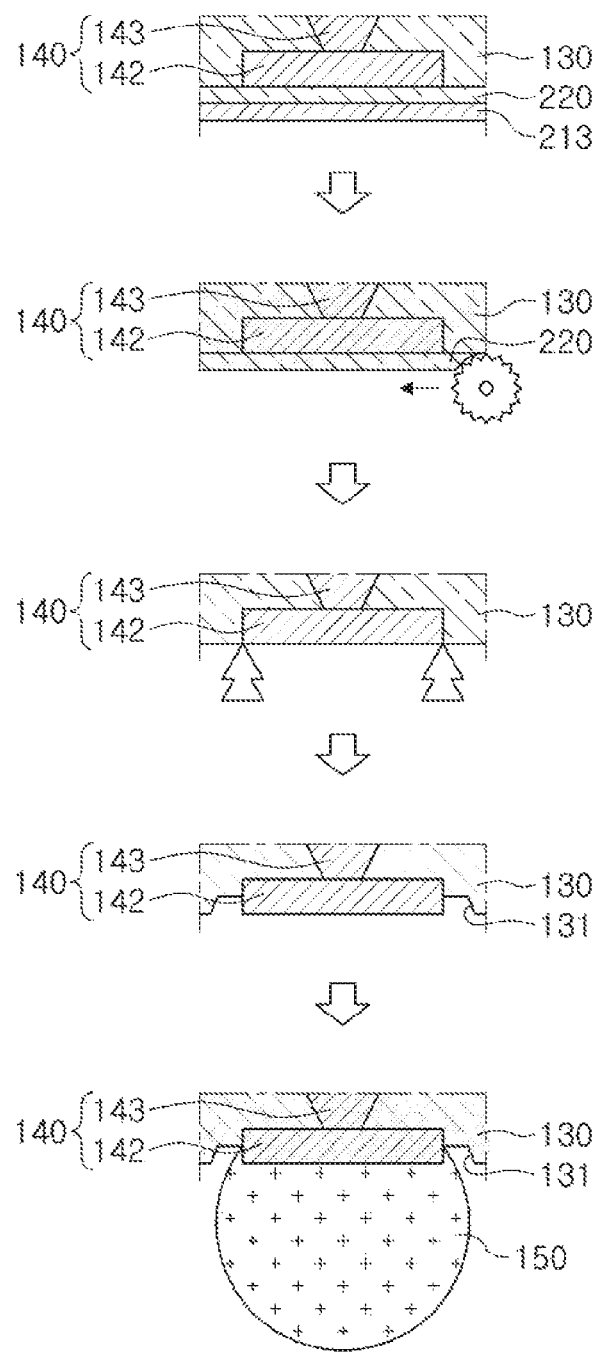
FIGS. 12A through 12C are schematic views illustrating various more detailed examples of a final process of FIG. 11B.
Figure 12B:
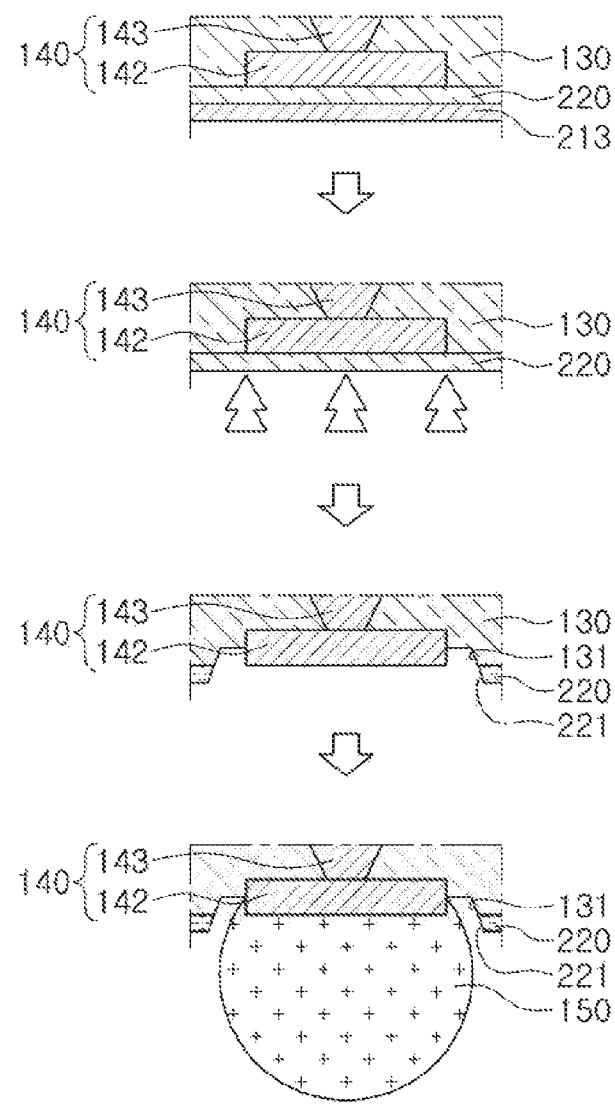
Figure 12C:
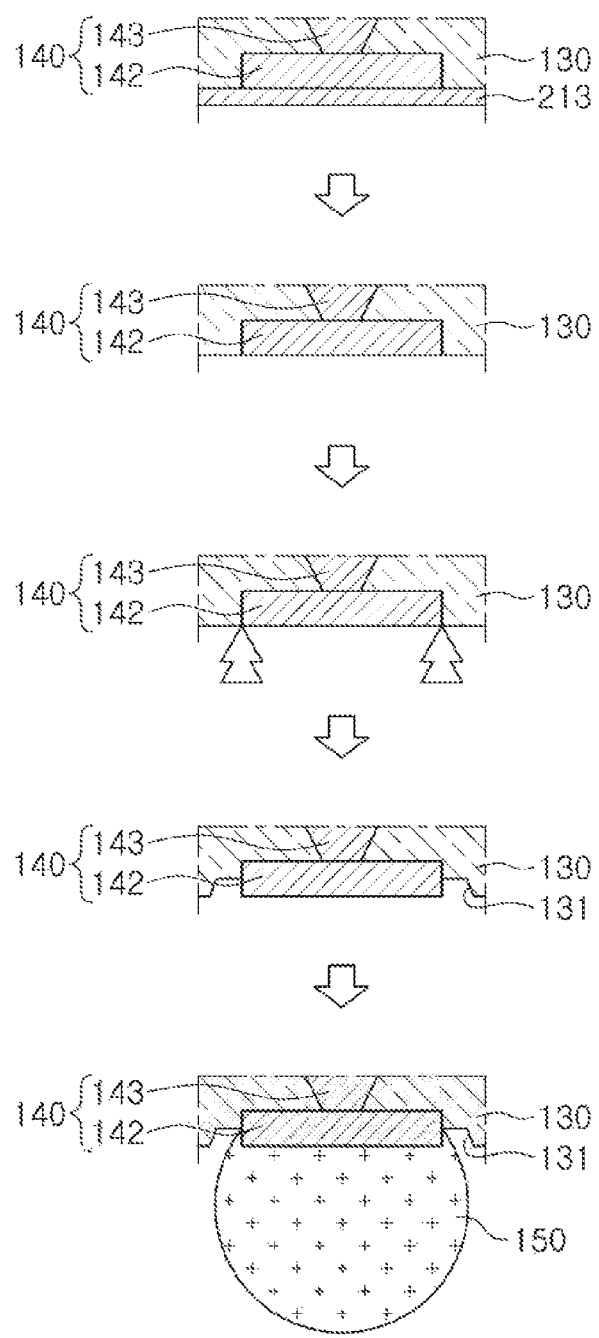

FIGS. 12A through 12C are schematic views illustrating various more detailed examples of a final process of FIG. 11B.

Referring to FIG. 12A, the metal layer 213 remaining after the carrier 210 is separated may be removed by etching, and the resin layer 220 may be then removed by the grinding. Then, the openings 131 may be formed using laser drilling. Then, the desmear processing may be performed, and the connection terminals 150 may be formed. In this case, the resin layer 220 may not remain in a final product.

Referring to FIG. 12B, the metal layer 213 remaining after the carrier 210 is separated may be removed by etching, and the openings 131 and 221 may be directly formed using laser drilling without performing the grinding. Processes other than the abovementioned process are substantially the same as those described above. In this case, in a final product, the resin layer 220 may remain as the outermost layer of the passivation layer 130, and the openings 221 extending from the openings 131 formed in the passivation layer 130 may be formed in the resin layer 220. In this case, the openings 131 and 221 may be formed at a depth greater than that of the openings in the process described with reference to FIG. 12A. That is, a step between a lower surface of the UBM pad 142 and the openings 131 and 221 may become large.

Referring to FIG. 12C, the resin layer 220 may be omitted in a process. In this case, the metal layer 213 remaining after the carrier 210 is separated may be etched, and the openings 131 may be directly formed using laser drilling without performing the grinding. Processes other than the abovementioned process are substantially the same as those described above. In this case, a final product may be substantially the same as that in a case of using the grinding described above.

As set forth above, according to the exemplary embodiment in the present disclosure, a semiconductor device having a structure of a UBM layer capable of having a simplified process and securing high reliability may be provided.

Since the semiconductor device is manufactured by, for example, a UBM layer first method, an additional carrier may be omitted in a process, a dedicated line for forming the UBM layer may be omitted, and a risk due to foreign materials after a package process may be lowered. In addition, in a final structure, UBM pads are disposed so that at least portions thereof are embedded in a passivation layer, such that side surfaces of the UBM pads may be exposed, resulting in improvement of reliability.

While exemplary embodiments have been shown and described above, it will be apparent to those skilled in the art that modifications and variations could be made without departing from the scope of the present invention as defined by the appended claims.

What is claimed is:

1. An interposer comprising:
   a passivation layer;
   a first redistribution layer (RDL) disposed on the passivation layer;
   under bump metallurgy (UBM) pads at least partially embedded in the passivation layer;
   UBM vias penetrating through a portion of the passivation layer and electrically connecting the first RDL and the UBM pads to each other; and
   a resin layer disposed on a lower surface of the passivation layer and having openings,
   wherein each opening exposes at least a portion of a lower surface of respective UBM pad, and
   wherein a width of an upper surface of each UBM via in contact with the redistribution layer is greater than that of a lower surface thereof in contact with the respective UBM pad.

2. The interposer of claim 1, further comprising:
   first connection terminals disposed on the openings, wherein each first connection terminal is connected to the exposed lower surface of the respective UBM pad.

3. The interposer of claim 1, further comprising:

an insulating layer disposed on an upper surface of the passivation layer; and a second RDL disposed on un upper surface of the insulating layer, wherein the first RDL is embedded in the insulating layer.

4. The interposer of claim 3, further comprising:

second connection terminals disposed on the upper surface of the insulating layer, wherein the second RDL includes a plurality of connection terminal pads, and each second connection terminal is connected to the respective connection terminal pad.

5. The interposer of claim 3, further comprising:

vias penetrating through at least portions of the insulating layer and electrically connecting the first RDL and the second RDL to each other, wherein a width of an upper surface of each via in contact with the second RDL is greater than that of a lower surface thereof in contact with the first RDL.

6. The interposer of claim 3, wherein a lower surface of the insulating layer is disposed on the same level as that of a lower surface of the first RDL.

7. The interposer of claim 1, wherein a width of a lowermost portion of each opening is greater than that of an uppermost portion thereof.

8. The interposer of claim 1, wherein the lower surface of the each UBM pad has a step with respect to a lower surface of the resin layer.

9. The interposer of claim 1, wherein the each UBM via has a reverse trapezoidal cross-sectional shape.

10. The interposer of claim 9, wherein the each opening has a trapezoidal cross-sectional shape.

11. The interposer of claim 9, wherein the each UBM via is a filled-via.

12. The interposer of claim 9, wherein the each UBM pad has a block cross-sectional shape.

* * * * *